US011004490B2

(12) United States Patent
Sakhare et al.

(10) Patent No.: US 11,004,490 B2
(45) Date of Patent: May 11, 2021

(54) SPIN ORBIT TORQUE MAGNETORESISTIVE RANDOM ACCESS MEMORY DEVICE

(71) Applicants: IMEC vzw, Leuven (BE); Katholieke Universiteit Leuven, Leuven (BE)

(72) Inventors: Sushil Sakhare, Heverlee (BE); Kevin Garello, Leuven (BE); Mohit Gupta, Heverlee (BE); Manu Komalan Perumkunnil, Leuven (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 16/716,024

(22) Filed: Dec. 16, 2019

(65) Prior Publication Data

US 2020/0202914 A1 Jun. 25, 2020

(30) Foreign Application Priority Data

Dec. 20, 2018 (EP) .................................... 18214310

(51) Int. Cl.
| | |
|---|---|
| *G11C 11/16* | (2006.01) |
| *H01L 27/22* | (2006.01) |
| *H01L 43/02* | (2006.01) |

(52) U.S. Cl.
CPC ........ *G11C 11/161* (2013.01); *G11C 11/1655* (2013.01); *G11C 11/1657* (2013.01); *G11C 11/1659* (2013.01); *G11C 11/1673* (2013.01); *G11C 11/1675* (2013.01); *H01L 27/228* (2013.01); *H01L 43/02* (2013.01)

(58) Field of Classification Search
CPC .................................................. G11C 11/161

USPC ......................................................... 365/158
See application file for complete search history.

(56) References Cited

U.S. PATENT DOCUMENTS

| | | | |
|---|---|---|---|
| 2017/0077177 A1* | 3/2017 | Shimomura | ........ G11C 11/1675 |
| 2018/0040807 A1* | 2/2018 | Saito | ................... G11C 11/1659 |
| 2018/0061467 A1* | 3/2018 | Kan | ..................... G11C 11/1675 |

(Continued)

FOREIGN PATENT DOCUMENTS

| | | |
|---|---|---|
| CN | 107316936 | 11/2017 |
| EP | 3 343 564 A1 | 7/2018 |
| WO | WO 2018/038849 A1 | 3/2018 |

OTHER PUBLICATIONS

Ahmed et al., "A Comparative Study Between Spin-Transfer-Torque and Spin-Hall-Effect Switching Mechanisms in PMTJ Using SPICE", IEEE Journal on Exploratory Solid-State Computational Devices and Circuits, Oct. 13, 2017, p. 74-82.

(Continued)

*Primary Examiner* — Min Huang
(74) *Attorney, Agent, or Firm* — Knobbe, Martens, Olson & Bear, LLP

(57) ABSTRACT

The disclosed technology relates generally to magnetic random access memory, and more particularly to spin-orbit-torque (SOT) magnetoresistive random access memory (MRAM). According to an aspect, a MRAM device comprises a first transistor, a second transistor, and a resistive memory element. The resistive memory element comprises a magnetic tunnel junction (MTJ) pillar arranged between a top electrode and bottom electrode having a first terminal and a second terminal. According to another aspect, a method of using the MRAM device is disclosed.

17 Claims, 4 Drawing Sheets

(56) References Cited

U.S. PATENT DOCUMENTS

| | | | |
|---|---|---|---|
| 2018/0174634 A1* | 6/2018 | Kato | G11C 11/1659 |
| 2019/0006415 A1* | 1/2019 | Li | H01L 43/08 |
| 2019/0334080 A1* | 10/2019 | Ahmed | G11C 11/1653 |
| 2020/0005844 A1* | 1/2020 | Alhalabi | G11C 11/1675 |
| 2020/0075670 A1* | 3/2020 | Lin | H01L 43/08 |
| 2020/0241840 A1* | 7/2020 | Ikegami | G11C 11/1675 |

OTHER PUBLICATIONS

Chang et al., "Evaluation of Spin-Hall-assisted STT-MRAM for Cache Replacement", Department of Electronic and Information Engineering, Beihang University, Jul. 2016, p. 73-78.

Kim et al., "DSTT-MRAM: Differential Spin Hall MRAM for On-chip Memories", School of Electrical and Computer Engineering, Purdue University, in 11 pages.

Lee, "Integration of Voltage-Controlled Spintronic Devices in CMOS Circuits", UCLA Electronic Theses and Dissertations, Jan. 1, 2017, p. 16-55.

Raha et al., Designing Energy-Efficient Intermittently Powered Systems Using Spin-Hall-Effect-Based Nonvolatile SRAM, IEEE Transactions on Very Large Scale Integration (VLSI) System, vol. 26, No. 2, Feb. 2018, p. 294-307.

Rowlands et al., "Nanosecond magnetization dynamics during spin Hall switching of in-plane magnetic tunnel junctions", Kavli Institute, Cornell University, 2017 in 5 pages.

Seo et al., "Area-Efficient SOT-MRAM With a Schottky Diode", IEEE Electron Device Letters, vol. 37, No. 8, Aug. 2016, p. 982-985.

Seo et al., "High-Density SOT-MRAM Based on Shared Bitline Structure", IEEE Transactions on Very Large Scale Integration (VLSI) Systems, vol. 26, No. 8, Aug. 2018, p. 1600-1603.

Shi et al., "Fast, low-current spin-orbit torque switching of magnetic tunnel junctions through atomic modifications of the free layer interfaces", Kavli Institute, Cornell University, in 18 pages.

Van Den Brink et al., Spin-Hall-assisted magnetic random access memory, AIP Publishing LLC, Applied Physics Letters 104, 2014 in 3 pages.

Wang et al., "Tunnel Junction with Perpendicular Magnetic Anisotropy: Status and Challenges", Micromachines, 2015, p. 1023-1045.

Zeinali et al., "Ultra-Fast SOT-MRAM Cell with STT Current for Deterministic Switching", IEEE 35$^{th}$ International Conference on Computer Design, 2017, p. 463-468.

Zhang et al., "Stateful Reconfigurable Logic via a Single-Voltage-Gated Spin Hall-Effect Driven Magnetic Tunnel Junction in a Spintronic Memory", IEEE Transactions of Electron Devices, vol. 64, No. 10, Oct. 2017, p. 4295-4301.

European Extended Search Report dated Jun. 13, 2019 in European Patent Application No. 18214310.7; 7 pages.

* cited by examiner

SPIN ORBIT TORQUE MAGNETORESISTIVE RANDOM ACCESS MEMORY DEVICE

CROSS-REFERENCE TO RELATED APPLICATIONS

This application claims foreign priority to European Patent Application No. 18214310.7, filed Dec. 20, 2018, the content of which is incorporated by reference herein in its entirety.

BACKGROUND

Field

The disclosed technology relates generally to magnetic random access memory, and more particularly to spin-orbit-torque (SOT) magnetoresistive random access memory, as well as methods for operating the same.

Description of the Related Technology

Magnetic random access memory (MRAM) is a promising memory technology. MRAM can, e.g., serve as a complement or replacement for static random-access memories (SRAMs). The spin torque transfer MRAM (STT-MRAM) is an example of such a technology, which enables non-volatile storage of data in magnetic tunnel junctions (MTJs). An MTJ comprises a reference layer, a tunnel barrier layer and a free layer arranged in a stacked configuration, e.g., in a pillar, wherein the relative magnetic orientation of the reference layer and the free layer determines an electric resistance of the MTJ. The MTJ may present a relatively low resistance when the magnetization of the reference layer and the free layer are aligned in parallel, and a relatively high resistance when the magnetization of the reference layer and the free layer, respectively, are anti-parallel. The magnetization of the reference layer is fixed or "pinned," and is therefore also referred to as a "pinned layer." The direction of the magnetization of the free layer may be varied by passing a relatively high current through the MTJ.

SUMMARY OF CERTAIN INVENTIVE ASPECTS

To enable faster and more power-efficient switching of the magnetization, spin-orbit-torque MRAM (SOT-MRAM) has been proposed. In some SOT-MRAMs, the MTJ pillar includes, in a top-down direction towards the substrate, a reference layer, a tunnel barrier layer, a free layer and a SOT-generating layer. Since the reference layer is arranged above the free layer the MTJ pillar may be referred to as a "top-pinned" MTJ. The reference layer and the SOT-generating layer may be connected to a top electrode and a bottom electrode, respectively. By conducting a current through the SOT-generating layer, in a direction parallel to the MTJ junction, a torque may be exerted on the magnetization of the free layer. Further, to achieve deterministic switching of the MTJ, the SOT may be used in combination with an additional in-plane magnetic field.

Although the SOT-MRAM technology can provide a faster and more power-efficient alternative to the STT-MRAM, the routing and space requirements of the bit-cells remains a challenge. An objective of the disclosed technology is to address this challenge. Additional or alternative objectives may be understood from the following.

According to an aspect of the present inventive concept there is provided a method for controlling an MRAM bit-cell comprising a first transistor, a second transistor, and a resistive memory element comprising a magnetic tunnel junction (MTJ) pillar arranged between a top electrode and bottom electrode having a first terminal and a second terminal. The gates of the first and second transistors are connected to a common word line, the first terminal of the bottom electrode is connected to a first source/drain terminal of first transistor, a second source/drain terminal of the first transistor is connected to a write bit line, the second terminal of the bottom electrode is connected to a first read bit line, the top electrode is connected to a first source/drain terminal of the second transistor, and a second source/drain terminal of the second transistor is connected to a second read bit line. The method according to the present aspect comprises the steps of applying a first supply voltage to the common word line, and changing a state of the resistive memory element from a first state to a second state by applying the first supply voltage to the write bit line and applying a second supply voltage to the first read bit line, thereby generating a first spin orbit torque (SOT)-generating current through the bottom electrode and a spin transfer torque (STT)-generating current through the MTJ pillar. Further, the method comprises changing the state of the resistive memory element from the second state to the first state by applying the first supply voltage to the first read bit line and applying the second supply voltage to the write bit line, thereby generating a second SOT-generating current through the bottom electrode and an STT-generating current through the MTJ pillar.

The present inventive concept provides a three-terminal resistive memory element that is connected with two access transistors, forming a 2T1R bit-cell. Further, a write circuit may be provided, including driving transistors that are controlled by logic signals in order to produce the SOT and STT-generating currents. Further, a read circuit may be provided, including sensing amplifiers.

The second transistor is arranged to control access to the top electrode of the MTJ pillar, and thus to control the current flowing through the pillar. This current may either be an STT-generating current used during write operations, or a read current for reading the logic state of the resistive element during the read operation.

The first transistor is arranged to control access to the first terminal of the bottom electrode, or SOT-generating layer, and thus to control the SOT-generating current used during write operations.

The first and second transistors may be controlled by a single, common word line so as to advantageously reduce the number of terminals of the resulting bit cell. The common word line may be used for applying the first supply voltage, which may be sufficiently high to exceed a threshold voltage of the first and second transistors, such that the first and transistor are activated and assume their conducting, or open state.

During the write operation, the resistive memory element may be switched either from a parallel state to an anti-parallel state, or from an anti-parallel state to a parallel state. The switching is enabled by applying the first supply voltage, such as a drain supply voltage VDD, to the common word line, and the second supply voltage, such as ground or a source supply voltage VSS, to the second read bit line in order to open a current path through the bottom electrode (between the first terminal and the second terminal), and another current path through the MTJ pillar.

For switching a MTJ pillar from a parallel state to an anti-parallel state, a voltage difference may be applied between the second terminal and the first terminal of the bottom electrode. The voltage difference may, for example, be achieved by applying the first supply voltage to the first read bit line and the second supply voltage to the write bit line. As a result, an SOT-generating current will flow from the first read bit line to the write bit line, via the SOT-generating electrode and the first transistor, to assist in the switching the MTJ pillar from the parallel state to the anti-parallel state. Further, an STT-generating current will flow from the first read bit line to the second read bit line, through the MTJ pillar.

The STT-generating current, however, flows in a direction that counteracts the switching from the parallel to the anti-parallel state. In the present example, the STT-generating current flows through the MTJ pillar from the bottom electrode towards the top electrode, which is a direction that tends to bring the MTJ pillar into the parallel state.

This situation may, however, be solved by the characteristics of the first transistor, which may be selected such that it operates in saturation mode when the SOT-generating current flows from the first read bit line to the write bit line. As a result, the SOT-generating current is larger than the STT-generating current, and the MTJ pillar will be switched from the parallel to the anti-parallel state by the SOT-generating current.

For a switching from an anti-parallel to a parallel state, the voltage difference over the bottom electrode may be reversed by applying the first supply voltage to the write bit line and the second supply voltage to the first read bit line. As a result, this time an SOT-generating current will flow in the opposite direction in the SOT-generating electrode, from the write bit line to the first read bit line, to assist in the switching from the anti-parallel state to the parallel state. Further, an STT-generating current will flow from the write bit line to the second read bit line, through the MTJ pillar in a similar way as described above for the parallel to anti-parallel case. In this case, the SOT-generating current is supported by the STT-generating current, since both currents try to bring the MTJ pillar into the parallel state.

The first transistor may in this state operate in source degeneration mode, in which the absolute value of the SOT-generating current flowing through the transistor is lower than the SOT-generating current in the saturation mode. The switching of the resistive memory element is, however, assisted by the STT-generating current, which enables the state to be changed from anti-parallel to parallel.

The first and second access transistors may be field effect transistors (FETs), for example of n-type, or bipolar junction transistors (BJTs), for example NPN BJTs.

The present inventive concept hence provides an MRAM bit-cell in which the two access transistors can advantageously be controlled by a single word line. This is enabled by using the different characteristics of the transistor controlling the SOT-generating current, such that the switching is caused by the SOT-generating current when the transistor operates in the saturation mode and by the SOT-generating current and the STT-generating current in combination when the transistor operates in source degeneration mode.

The state of the resistive memory element may be read by applying the first supply voltage to the common word line and the second supply voltage to the second read bit line to in order to open a current path between the first read bit line and the second read bit line, via the MTJ pillar. A read voltage may be applied to the first read bit line (and the write bit line) to create a current that flows through the MTJ pillar to the second read bit line, to which the second supply voltage (such as ground or VSS) may be supplied.

In the following, the term MTJ pillar will be used to refer to the stack structure comprising the actual magnetic tunnel junction that provides the tunnel function, and (among others) the reference layer and the free layer.

As described herein, a reference layer refers to a layer having a magnetization which is fixed or pinned. That is, the direction of the magnetization vectors or magnetic moments of the reference layer is fixed or pinned. The reference layer may also be referred to as the fixed layer or the pinned layer.

The tunnel barrier layer is arranged between the reference layer and the free layer. The tunnel barrier layer may be a non-ferromagnetic and electrically insulating layer. The tunnel barrier layer is adapted to allow a tunneling current thereacross.

As described herein, a free layer refers to a layer having a magnetization which may be varied or switched. That is, the direction of the magnetization vectors or magnetic moments of the free layer may be varied or switched. The direction of the magnetization of the free layer may be varied between two states, including a parallel state wherein the magnetization direction of the free layer is parallel to the magnetization direction of the reference layer and an anti-parallel state wherein the magnetization direction of the free layer is anti-parallel to the magnetization direction of the reference layer.

As described herein, references to "bottom-up direction," "bottom-down direction," "on" and "below" generally refer to the order of the layers in the stack or pillar in relation to a substrate. The above terms do hence not refer to an absolute orientation of the layer stack or MTJ pillar but to a relative ordering or a sequence of the layers forming the resistive memory element.

The bottom electrode may also be referred to as a SOT-generating layer. The free layer may be arranged on, preferably directly on, the SOT-generating layer. The SOT-generating layer may be formed such that a current may be conducted between the first and second terminal and within a plane of extension of the SOT-generating layer. Consequently, the current may be conducted along or in a direction that is parallel to the free layer. The SOT-generating layer is formed by a material exhibiting a relatively large spin-orbit coupling such that when a current is conducted between the first and second terminals, a torque is exerted on the magnetization or magnetic moments of the free layer.

By passing a sufficient current (e.g., SOT-generating current) between the first and second terminals of the bottom electrode or SOT-generating layer, the magnetization of the free layer may be switched between the parallel state and the anti-parallel state via SOT.

The magnetization of the free layer may also be switched between the parallel and anti-parallel state by passing a sufficient current through the MTJ, i.e., orthogonal to the free layer. This mechanism employs the spin-transfer-torque (STT) effect, and is generally a much slower process than the SOT switching due to an intrinsic delay of the STT.

By combining an STT-generating current and an SOT-generating current, the combined torque exerted on the free layer via the SOT and the STT effect may switch the magnetization of the free layer faster and at a lower total power than by SOT or STT alone.

The tunnel magneto-resistance (TMR) is a measure of the difference in the MTJ electrical resistance between the anti-parallel state and the parallel state of the magnetization of the free layer. The different states of the free layer, and accordingly the different resistance levels, may be used to represent either a logic "1" or a logic "0." A reading operation of the MTJ may be performed by measuring a resistance of the MTJ at a read current passed through the MTJ. A writing operation of the MTJ may be performed by changing of flipping the resistance level of the MTJs from the high-resistance state to the low-resistance state and vice versa by applying the SOT-generating current and the STT-generating current. A high discrimination between the STT-generating current and the read current is desirable, since the reading operation otherwise risks to cause unintended flipping of the state of the resistive memory element.

The MRAM bit-cell, as used herein, refers to an MRAM wherein data may be stored in a resistive memory element or an array of resistive memory element, wherein the magnetization of the free layer of each MTJ pillar may be switched between the parallel state and the anti-parallel state by an STT-generating current in combination with an SOT-generating current.

The reference layer may be a magnetic layer. The free layer may be a magnetic layer. As described herein, a magnetic layer hereby refers to a layer formed by a material having a net magnetization which is non-zero. A magnetic layer may, e.g., be formed by a ferromagnetic layer. The tunnel barrier layer may be a dielectric layer. The SOT-generating bottom electrode may be formed by a metal layer.

According to an embodiment, the MTJ pillar may comprise a pinned layer and a free layer, wherein the pinned layer is coupled to the top electrode and the free layer is coupled to the bottom electrode.

According to an embodiment, the MTJ pillar may comprise a tunnel barrier arranged between the free layer and the pinned layer and extending in a first plane, wherein the free layer and/or the pinned layer is/are magnetized in a direction substantially perpendicular to the first plane. In another embodiment, the free layer and/or the pinned layer may be magnetized in a direction parallel to the first plane.

It will be appreciated that the first supply voltage and the second supply voltage may represent different voltage levels. The voltage level of the first supply voltage may for example be higher than the voltage level of the second supply voltage, wherein the first supply voltage in some examples may correspond to a drain supply voltage VDD and the second supply voltage to a source supply voltage VSS or ground. Further, it will be appreciated that each of the first and the second transistors may have a gate-source threshold that is lower than the voltage level difference between the first supply voltage and the second supply voltage. This allows for the transistors to operate either in saturation mode or source degeneration mode. By allowing the transistors to operate in saturation mode, the SOT-generating current will be determined primarily by the supply voltages and the resistance of the SOT-generating layer. To allow for this, a transistor with a small drain-source resistance (RDS) should preferably be chosen. When in source degeneration mode, the SOT-generating current will be limited by the resistance of the transistor, as the gate-source voltage in this case is below the threshold voltage. The transistor may thus be substantially equivalent to an ideal transistor source degenerated circuit, having a series resistance with the source.

According to an embodiment, the first supply voltage and/or the second supply voltage may be applied to the first read bit line and/or the write bit line for a time period of less than 2 nanoseconds, preferably less than 1 nanosecond, more preferably less than 500 picoseconds. Thereby, the MRAM bit cell may be used in high-frequency circuitry, such as integrated circuits clocked with a frequency of at least 500 MHz, preferably 1 GHz, more preferably 2 GHz. By using a combination of both the SOT-generating current and the STT-generating current to change the state of the MTJ pillar, the voltages may be applied for periods of time shorter than or up to 2 nanoseconds, 1 nanosecond or 500 picoseconds, and within that period of time change the state of the MTJ pillar.

According to another aspect of the present inventive concept, there is provided an MRAM bit cell which may be similarly configured as the bit cell discussed in connection with the first aspect and the related embodiments. Thus, the bit cell comprises a first transistor, a second transistor, and a resistive memory element comprising a magnetic tunnel junction, MTJ, pillar arranged between a top electrode and bottom electrode having a first terminal and a second terminal. The gates of the first and second transistors are connected to a common word line. Further, the first terminal of the bottom electrode is connected to a first source/drain terminal of first transistor, a second source/drain terminal of the first transistor is connected to a write bit line, the second terminal of the bottom electrode is connected to a first read bit line, the top electrode is connected to a first source/drain terminal of the second transistor, and a second source/drain terminal of the second transistor is connected to a second read bit line. The MRAM bit cell is configured to change a state of the resistive memory element from a first state to a second state when a first supply voltage is applied to the common word line and to the write bit line while a second supply voltage is applied to the first read bit line, so as to generate a first spin orbit torque (SOT)-generating current through the bottom electrode and a spin orbit torque (STT)-generating current through the MTJ pillar. Further, the MRAM bit cell is configured to change the state of the resistive memory element from the second state to the first state when the first supply voltage is applied to the common word line and to the read bit line while the second supply voltage is applied to the write bit line, so as to generate a second SOT-generating current through the bottom electrode and an STT-generating current through the MTJ pillar.

In some embodiments, a magnetic field may be applied to the MTJ pillar, wherein the magnetic field has a field direction that is substantially parallel to a current direction of the SOT-generating current flowing between the terminals of the bottom electrode. The magnetic field may for example be provided by means of an antiferroelectric layer that is integrated into the resistive memory element, and which may be combined with an MTJ pillar using perpendicular magnetic anisotropy in order to facilitate a deterministic switching.

This aspect may generally present the same or corresponding advantages as the former aspect, and will for the sake of brevity not be discussed to any further detail in the present application.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

All the figures are schematic, not necessarily to scale, and generally only show parts, which are necessary to elucidate embodiments of the present inventive concept, wherein other parts may be omitted or merely suggested.

DETAILED DESCRIPTION OF CERTAIN ILLUSTRATIVE EMBODIMENTS

Detailed embodiments of the present inventive concept will now be described with reference to the drawings. The present inventive concept may, however, be embodied in many different forms and should be construed as limited to the embodiments set forth herein; rather, these embodiments are provided by way of example, so that this disclosure will convey the scope of the inventive concept to those skilled in the art.

Figure 1:
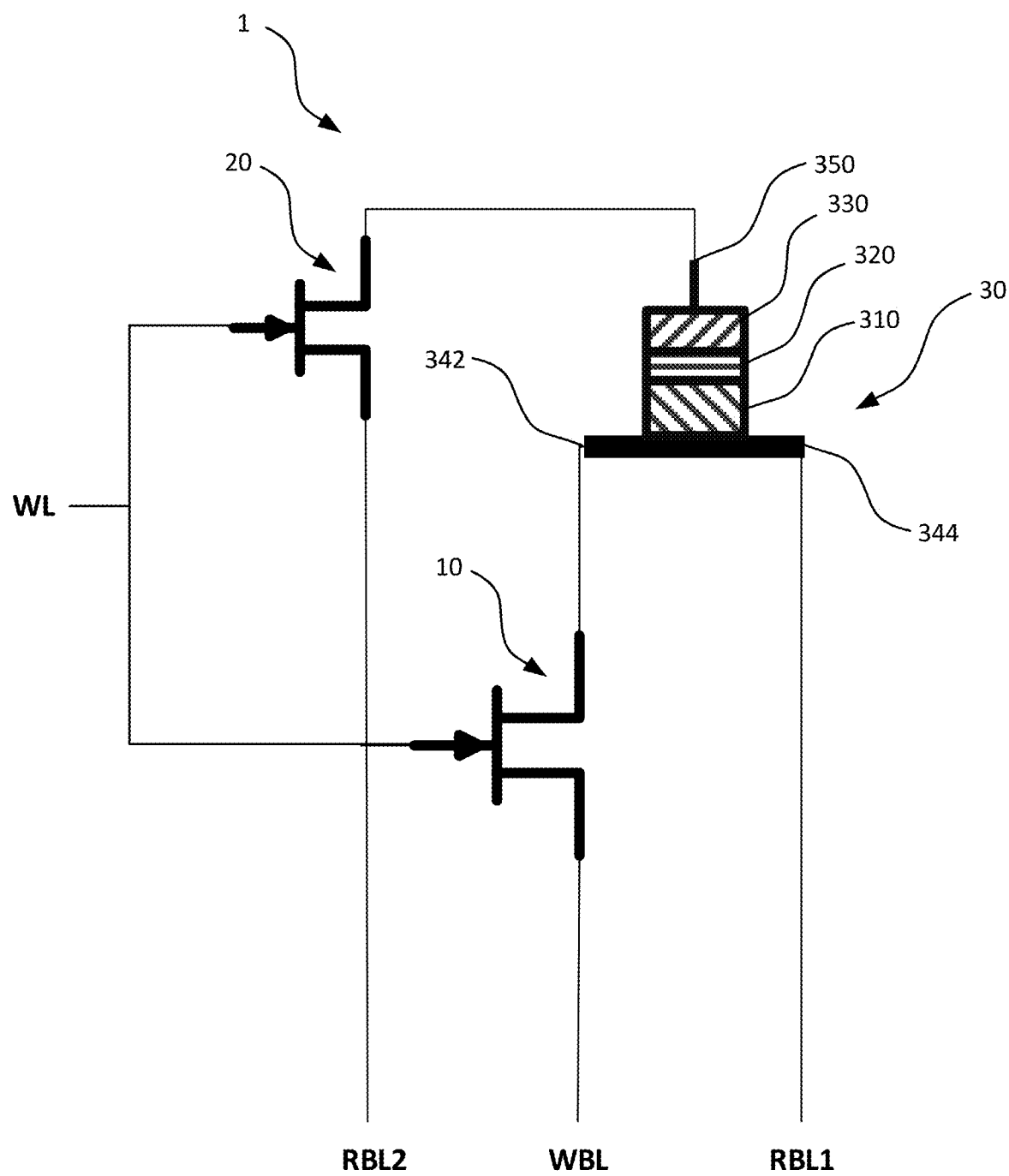
FIG. 1 shows a circuit diagram of a magnetoresistive random access memory (MRAM) bit cell, according to embodiments.

With reference to FIG. 1, a MRAM bit cell 1 is illustrated in a circuit schematic. The MRAM bit cell 1 comprises a resistive memory element, e.g., a magnetic tunnel junction (MTJ) pillar 30, comprising a bottom electrode with a first terminal 342 and a second terminal 344. The MTJ pillar 30 further comprises a free layer 310 adjacent to the bottom electrode, a pinned layer 330 connected to a top electrode 350, and a tunnel barrier 320 extending in a first plane and arranged between the free layer 310 and the pinned layer 330. The bottom electrode and the free layer 310 are arranged such that a current running from through the bottom electrode, e.g., in a first current direction from the first terminal 342 to the second terminal 344, may change the polarization of the free layer 310 to be parallel or anti-parallel with the polarization of the pinned layer 330. Thereby, a current flowing through the bottom electrode may change the state of the MTJ pillar 30, e.g., from a parallel (P) state to an anti-parallel (AP) state, or vice versa. Similarly, a current running in a second current direction, opposite the first current direction, e.g., from the second terminal 344 to the first terminal 342, may change the state of the MTJ pillar 30 from an AP-state to a P-state, or vice versa. In some embodiments, a magnetic field having a field direction in a plane substantially parallel to the first direction may influence and/or determine, which state the MTJ pillar is changed into by currents running in the first and second current directions, respectively.

When the MTJ pillar 30 is in a P-state, it may have a first resistance for a current running from the bottom electrode to the top electrode 350, whereas it in an AP-state has a second resistance, which is larger than the first resistance. The P-state may, when restoring data from the SRAM bit cell, represent a logical high, e.g., a logical 1 value, and the AP state may represent a logical low, e.g., a logical 0 value, or vice versa.

The MRAM bit cell 1 further comprises two access transistors in the form of a first transistor 10 and a second transistor 20. The first and the second transistors are field-effect transistors (FETs) such as junction FETs (JFETs), or insulated gate FETs (IGFETs), e.g., of n-type. The first transistor 10 is connected at a source terminal thereof to a write bit line WBL and at the drain terminal thereof to the first terminal 342 of the MTJ pillar 30. The gate of the first transistor 10 is connected to the gate of the second transistor 20 and to a word line signal, and the second transistor 20 is at a drain terminal thereof connected to the top electrode of the MTJ pillar 30. Moreover, the second terminal 344 of the MTJ pillar 30 is connected to a first read bit line RBL1, and a source terminal of the second transistor 20 is connected to a second read bit line RBL2.

The first and second transistors 10, 20 may alternatively be bipolar transistors, such as a bipolar junction transistor (BJT), e.g., a n-type/p-type/n-type (NPN) BJT, or alternatively a p-type/n-type/p-type (PNP) BJT. The first 10 and second transistors 20 may be of a similar type or may be of different types.

A supply voltage may, during a storing operation, e.g., when an operation in which the state of the MTJ pillar is set, be applied on each of the read bit lines RBL1 and RBL2, and on the write bit line WBL, respectively. The supply voltages may comprise a first supply voltage VDD and a second supply voltage VSS, where the voltage level of the second supply voltage VSS may be lower than the voltage level of the first supply voltage VDD. In some embodiments, the second read bit line RBL2 is connected to the same supply voltage, such as the second supply voltage VSS. The second supply voltage may be a ground connection, equipotential to a ground connection, a virtual ground, or the like. The first supply voltage VDD may relative to the second supply voltage VSS have a voltage of 0V-5V, preferably between 0.1 V-3 V, for instance between 0.3 V-1.5 V. Alternatively, the first supply voltage VDD is in the range of −5V-0V relative to the second supply voltage VSS. The first VDD and second supply voltages may depend on operating voltages in integrated circuits connected to or using the same power source as the MRAM bit cell 1. In some embodiments, the voltage difference between the first VDD and second supply voltage VSS is larger than or equal to the threshold voltage of the first transistor 10 and/or second transistor 20, such that |VDD−VSS|≥|Vth| for one or both of the first and second transistors.

Similarly, during a restore operation, i.e. when the state of the MTJ pillar is read, a read voltage may be applied to one or more of the write bit line WBL and the first read bit line RBL1. In some embodiments, the read voltage VREAD is different from the second supply voltage VSS, e.g., higher than the second supply voltage VSS. The read voltage VREAD may be lower than the first supply voltage VDD relative to the second supply voltage VSS, yet still larger than or equal to the threshold voltage of the first transistor 10 and/or second transistor 20, e.g., |VREAD−VSS|≥|Vth|.

Figure 2:
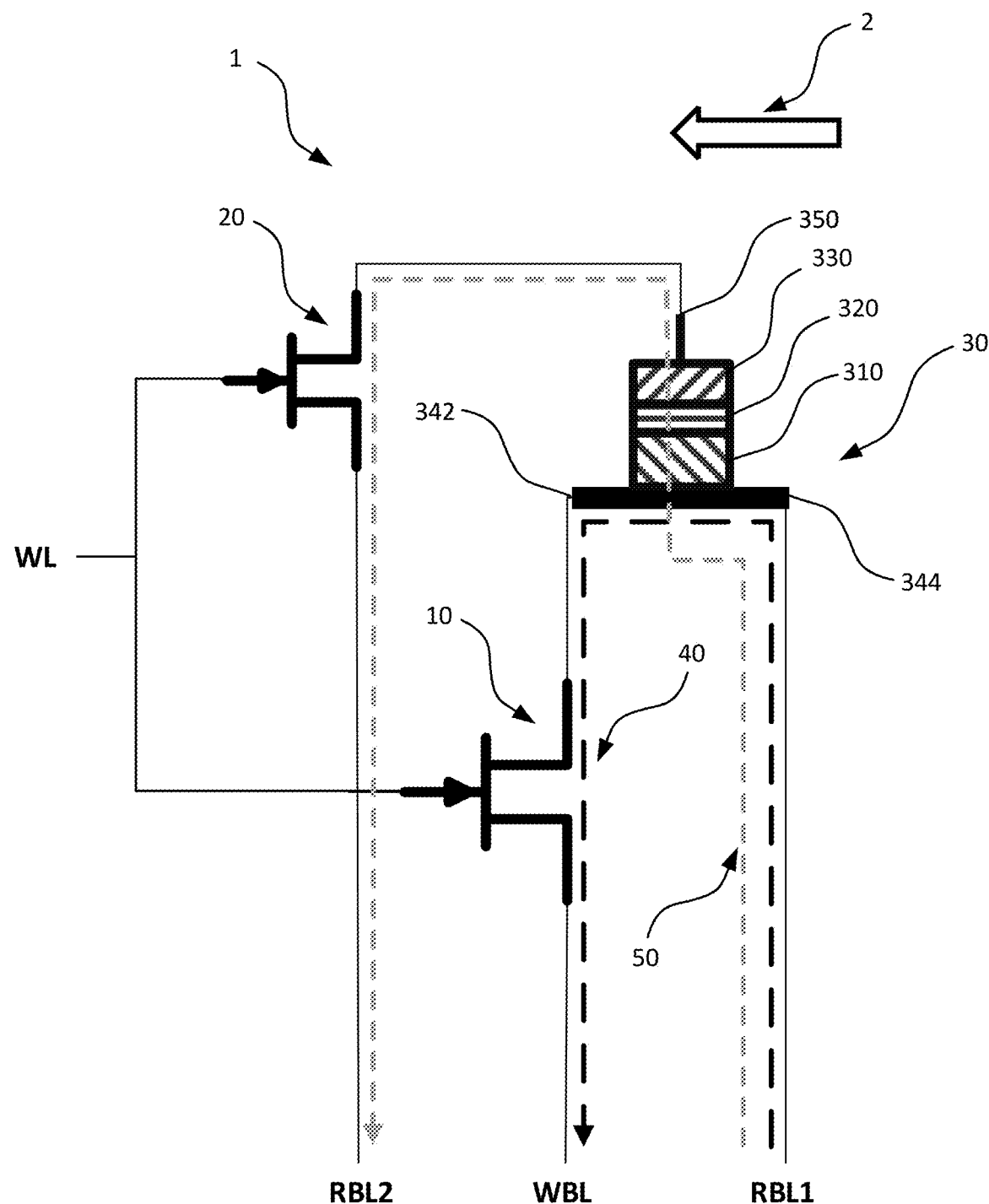
FIGS. 2 and 3 show circuit diagrams of the embodiment illustrated in FIG. 1, depicting currents during programming of the MRAM bit cell.

FIG. 2 shows the circuit schematic of the MRAM bit cell 1 of FIG. 1 during a first storing operation, and will now be used for illustrating an operation of storing data by changing the state of the MTJ pillar 30 of the MRAM bit cell 1.

In the MRAM bit cell 1 shown in FIG. 2, a magnetic field 2 is furthermore applied in-plane with the MTJ pillar 30. As described herein, an in-plane direction of a magnetic field 2 with respect to the MTJ pillar 30 refers to the direction of the magnetic field 2 that is directed in a plane substantially parallel to first plane, in which the tunnel barrier 320 of the MTJ pillar 30 extends. The magnetic field 2 has a field direction indicated by the direction of the arrow in FIG. 2. The field direction of the magnetic field may determine or influence the state, e.g., P or AP state, which the MTJ pillar 30 is set in, when a current is flowing through the bottom electrode in the first current direction, i.e. from the first terminal 342 to its second terminal 344 of the bottom electrode, or in the second current direction opposite the first current direction. The magnetic field may occur due to operation of the MRAM bit cell 1 or circuitry, such as integrated circuits connected thereto, or may be applied externally.

In the present example, the word line WL, which is connected to the gates of both the first and second transistors 10, 20, is connected to the first supply voltage VDD, having a larger voltage level than the second supply voltage VSS, and thereby at a high potential. The second read bit line RBL2, connected to the source of the second transistor 20 is furthermore connected to the second supply voltage VSS and thus at a low potential. The voltage difference between the high potential of the word line WL and the second read bit line RBL2, e.g., the gate-source voltage of the second transistor 20, is set such that the second transistor 20 in the embodiment shown in FIG. 2 is operating in its saturation region. This voltage difference is defined by the voltage level difference between the first supply voltage VDD and the second supply voltage VSS Similarly, the write bit line WBL is connected to the second supply voltage VSS and thereby at a low potential. The first transistor 10 is chosen to have properties similar to those of the second transistor 20 to operate in its saturation region. In another embodiment, the first and second transistors 10, 20 may be chosen to have properties, such that they, when the first supply voltage VDD is applied on the gates thereof and the second supply voltage VSS is applied on the sources thereof, operate in the linear region instead of or in combination with the saturation region. In some embodiments, the first 10 and the second transistors 20 may be chosen to have properties, such as threshold voltages, drain-source resistances, or the like, different from one another.

The first read bit line RBL1 is in the present example connected to the first supply voltage VDD and is therefore at a high potential. In another embodiment, the potential difference between the word line WL and the second write bit line RBL2 or the write bit line WBL may be different, e.g., when applying other supply voltages.

Since the first transistor 10 is in saturation mode, the voltage at the first terminal 342 of the bottom electrode is approximately equal to the second supply voltage VSS. As the second terminal 344 of the bottom electrode is connected to the first read bit line RBL1 and thus to the first supply voltage VDD, the voltage drop across the bottom electrode will cause a SOT-generating current 40 to run through the bottom electrode in the second current direction. This SOT-generating current will, due to direction of the magnetic field change the state of the MTJ pillar 30 from the P to the AP state. The voltage level difference between the first VDD and the second supply voltage VSS as well as the resistance and material properties of the bottom electrode are chosen, such that the SOT-generating current is sufficiently large to change the state of the MTJ pillar 30.

In a similar manner, the second transistor 20 is also in saturation mode and the potential at the top electrode 350 of the MTJ pillar 30 is at a low potential, e.g., approximately equal to the voltage level of the second supply voltage VSS. This causes a STT-generating current 50 to run from the first read bit line RBL1 at the high potential equal to that of the first supply voltage VDD through the second terminal of the MTJ pillar 30, to the top electrode 350 of the MTJ pillar and to the second read bit line RBL2. This STT-generating current 50 will oppose the SOT-generating current 40 and push the MTJ pillar 30 towards the P state rather than the AP state. The STT-generating current 50, however, cannot prevent the state change of the MTJ pillar from the P state to AP state caused by the SOT-generating current 40, but will instead slow down the state change of the MTJ pillar. In some embodiments, the supply voltages VDD, VSS may be applied to the bit lines RBL2, WBL, RBL1 for a short period of time, causing the SOT-generating current 40 and STT-generating current 50 to be current pulses. The periods of these two current pulses 40, 50 may however be substantially alike.

Figure 3:
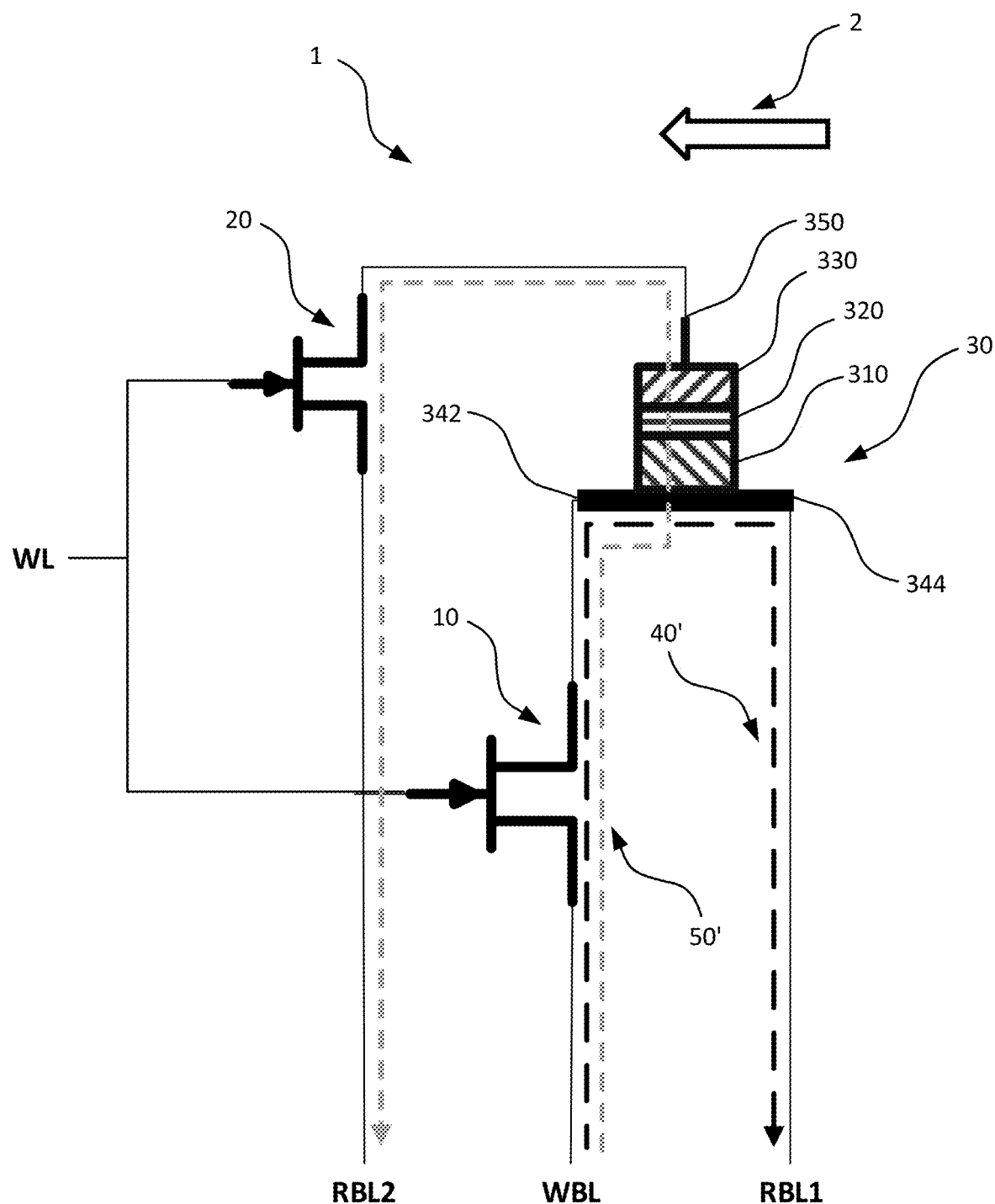

FIG. 3 shows the circuit schematic of the MRAM bit cell 1 of FIG. 1 during a second storing operation, in which the state of the MTJ pillar 30 is changed. The state change of the second storing operation is in this example opposite to that of the first storing operation.

A magnetic field 2 applied in-plane with the MTJ pillar 30 and having a field direction as indicated by the arrow and in the same direction as shown in FIG. 2 is similarly applied during the second storing operation. Furthermore, the second read bit line RBL2 is also during the second storing operation connected to the second supply voltage VSS and consequently at a low potential. The word line WL is, again, connected to the first supply voltage VDD, thereby, preferably, keeping the second transistor 20 operating in the saturation region. As described with reference to FIG. 2, various transistors with various properties may be used as first 10 and second transistors 20 to allow these to operate in various regions.

During the second storing operation, the first read bit line RBL1 is connected to the second supply voltage VSS and is thereby at a low potential, consequently leading the second terminal 344 of the bottom electrode of the MTJ pillar 30 to be at a low potential. The write bit line WBL is during the second storing operation connected to the first supply voltage VDD. Thereby, the gate-source voltage of the first transistor 10 is approximately 0 V. This allows the first transistor 10 to be in source degeneration mode, such that the first transistor 10 corresponds to an ideal transistor with a series resistor at the source, thereby introducing a voltage drop across drain-source the first transistor 10. The voltage at the first terminal 342 of the bottom electrode of the MTJ pillar is thereby approximately equal to the first supply voltage VDD with the voltage drop, VT1 across the drain-source of the first transistor 10 subtracted therefrom, e.g., VBE1=VDD−VT1, where VBE1 is the voltage at the first terminal 342 of the bottom electrode. The voltage drop across the drain-source of the first transistor 10 is smaller than the voltage difference between the first VDD and second supply voltage VSS.

This allows a SOT-generating current 40' to run from the write bit line WBL through the first transistor 10 in source degeneration mode through the bottom electrode of the MTJ pillar 30 in a first direction, e.g., from the first terminal 342 thereof to the second terminal 344 thereof. This SOT-generating current 40' may cause the MTJ pillar 30 to change state from the AP state to the P state. As the second transistor, however, is operating in the saturation region, the top electrode 350 of the MTJ pillar 30 will be at a low potential substantially equal to the voltage level of the second supply voltage VSS. Hence, a STT-generating current 50' will run from the write bit line WBL through the first transistor 10 and the first terminal 342 of the bottom electrode, through the top electrode 350 and to the second read bit line RBL2 through the second transistor 20. The STT-generating current 50' will, in addition to the SOT-generating current 40', act towards changing the state of the MTJ pillar 30 from the AP state to the P state. The SOT-generating current 40' will, however, still determine the state of the MTJ pillar 30, but the STT-generating current 50' will in this case aid in changing the state to the P state. This allows for a faster change of state of the MTJ pillar 30 from the AP state to the P state.

Similar to the first storing operation, the supply voltages VDD, VSS may in the second storing operation be applied to bit lines RBL2, WBL, RBL for short periods of time, thereby providing SOT 40' and STT 50' current pulses. The voltage levels of the supply voltages VDD, VSS as well as the properties of the first 10 and second transistors 20, and the MTJ pillar 30 may be provided, such that, in the first storing operation, the SOT-generating current 40 opposed by the STT-generating current 50 causes a switching time from the P to the AP state similar to the switching time from the AP to the P state caused by the SOT-generating current 40' assisted by the STT-generating current 50' in the second storing operation.

Figure 4:
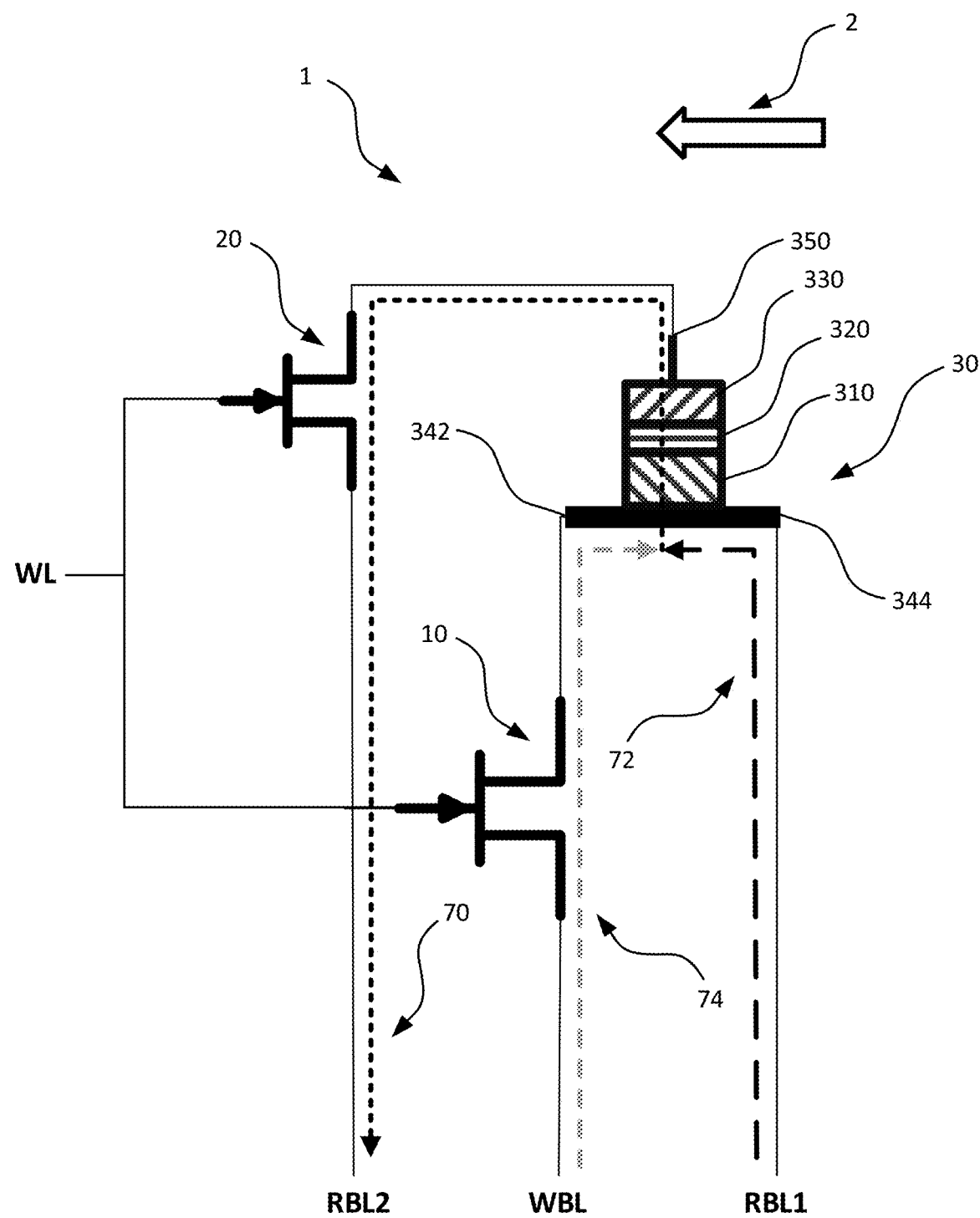
FIG. 4 shows a circuit diagram of the embodiment illustrated in FIG. 1, depicting currents through the circuit during reading of the MRAM bit cell.

FIG. 4 shows the circuit schematic of the MRAM bit cell 1 of FIG. 1 during a reading operation, and will now be used for illustrating an operation of reading data by reading the state of the MTJ pillar 30 of the MRAM bit cell 1.

During the reading operation, the second supply voltage VSS is applied to the second read bit line RBL2 and the first supply voltage VDD is applied to the word line WL. As this, again, causes the gate of the second transistor 20 to be at a high potential, and the source of the second transistor 20 to be at a low potential, such that the second transistor 20 operates in the saturation region. Hence, the top electrode 350 of the MTJ pillar 30 is at a low potential, substantially the same as the voltage level of VSS. Moreover, the magnetic field 2 is once again applied in-plane with the MTJ pillar 30 and with a field direction similar to the field described with reference to FIGS. 2 and 3.

The read voltage VREAD is during the reading operation applied to both the write bit line WBL and the first read bit line RBL1. The read voltage VREAD is higher than the second supply voltage VSS, but may in another embodiment be lower. This allows a read current 70 to run through the MTJ pillar 30 to the top electrode 350 and through the second transistor 20 to the second read bit line RBL2. The read current 70 is formed as a sum of a first read current portion 72 running from the first read bit line RBL1 through the second terminal 344 and through the MTJ pillar 30. Similarly, a second read current portion 74 runs from the write bit line WBL, through the first transistor 10 through the first terminal 342 of the bottom electrode and through the MTJ pillar 30. Due to the resistance through the first transistor 10, e.g. a drain-source on-resistance, or the like, the second read current portion 74 is smaller than the first read current portion 72. In another embodiment, the first transistor 10 may be switched off (e.g., by the gate-source voltage thereof being approximately 0 V), leading to the read current 70 to be formed by only the first read current portion 72.

The state of the MTJ pillar 30 may then be estimated by circuitry sensing or utilizing the resistance of the MTJ pillar 30, which depends on the state thereof, to obtain information about the state. The resistance of the MTJ pillar 30 may for instance be utilized by means of capacity charging time of the read current 70, or transistor pulls by the read current 70 in a circuitry connected to the MRAM bit cell 1 during the reading operation. The skilled person will appreciate that various circuitries, such as transistor circuits or the like may be used to estimate the state, and these will therefore not be elaborated further in this application.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A method for controlling a magnetoresistive random access memory (MRAM) device, the method comprising:
   providing the MRAM device comprising:
      a first transistor,
      a second transistor, and
      a resistive memory element comprising a magnetic tunnel junction (MTJ) pillar arranged between a top electrode and a bottom electrode having a first terminal and a second terminal,
   wherein:
      gates of the first and second transistors are connected to a common word line,
      the first terminal of the bottom electrode is connected to a first source/drain terminal of the first transistor,
      a second source/drain terminal of the first transistor is connected to a write bit line,
      the second terminal of the bottom electrode is connected to a first read bit line,
      the top electrode is connected to a first source/drain terminal of the second transistor, and
      a second source/drain terminal of the second transistor is connected to a second read bit line;
   applying a first supply voltage to the common word line;
   performing a first storing operation by changing a state of the resistive memory element from a first state to a second state, performing the first storing operation comprising:
      applying the first supply voltage to the write bit line and applying a second supply voltage to the first read bit line, thereby generating a first spin orbit torque (SOT)-generating current through the bottom electrode and a first spin transfer torque (STT)-generating current through the MTJ pillar; and
   performing a second storing operation by changing the state of the resistive memory element from the second state to the first state, performing the second storing operation comprising:
      applying the first supply voltage to the first read bit line and applying the second supply voltage to the write bit line, thereby generating a second SOT-generating current through the bottom electrode and a second STT-generating current through the MTJ pillar; and
   reading the state of the memory element,
   wherein each of performing the first storing operation, performing the second storing operation and reading the state of the resistive memory element comprises activating the first and second transistors and passing respective currents therethrough.

2. The method according to claim 1, further comprising: applying the second supply voltage to the second read bit line.

3. The method according to claim 1, further comprising: reading the state of the resistive memory element by:
   applying a read voltage to the write bit line,
   applying a read voltage to the first read bit line,
   sensing, by sensing means, a read current, of which at least a portion runs from the first read bit line through the MTJ pillar.

4. The method according to claim 1, wherein the MTJ pillar comprises a pinned layer and a free layer, the pinned layer being coupled to the top electrode and the free layer being coupled to the bottom electrode.

5. The method according to claim 4, wherein the MTJ pillar further comprises a tunnel barrier arranged between the free layer and the pinned layer and extending in a first plane, wherein the free layer and/or the pinned layer is/are configured to be magnetized in a direction substantially perpendicular to the first plane.

6. The method according to claim 1, wherein the first and second transistors are n-type transistors.

7. The method according to claim 1, wherein the first supply voltage and the second supply voltage have different voltage levels.

8. The method according to claim 7, wherein each of the first and second transistors has a gate-source threshold voltage that is lower than a voltage level difference between the first and second supply voltages.

9. The method according to claim 7, wherein the voltage level of the first supply voltage is larger than the voltage level of the second supply voltage.

10. The method according to claim 7, wherein the first supply voltage and/or the second supply voltage are/is applied to the first read bit line and/or the write bit line for a time period of less than 2 nanoseconds.

11. A magnetoresistive random access memory (MRAM) device, comprising:
a first transistor;
a second transistor; and
a resistive memory element comprising a magnetic tunnel junction (MTJ) pillar arranged between a top electrode and a bottom electrode having a first terminal and a second terminal,
wherein:
the gates of the first and second transistors are connected to a common word line,
the first terminal of the bottom electrode is connected to a first source/drain terminal of first transistor,
a second source/drain terminal of the first transistor is connected to a write bit line,
the second terminal of the bottom electrode is connected to a first read bit line,
the top electrode is connected to a first source/drain terminal of the second transistor, and
a second source/drain terminal of the second transistor is connected to a second read bit line,
wherein the MRAM device is configured such that each of changing a state of the resistive memory element and reading the state of the resistive memory element comprises activating the first and second transistors and passing respective currents therethrough.

12. The MRAM device of claim 11, wherein the MRAM device is configured to:
change a state of the resistive memory element from a first state to a second state when a first supply voltage is applied to the common word line and to the write bit line while a second supply voltage is applied to the first read bit line, so as to generate a first spin orbit torque (SOT)-generating current through the bottom electrode and a spin orbit torque (STT)-generating current through the MTJ pillar; and
change the state of the resistive memory element from the second state to the first state when the first supply voltage is applied to the common word line and to the first read bit line while the second supply voltage is applied to the write bit line, so as to generate a second SOT-generating current through the bottom electrode and an STT-generating current through the MTJ pillar.

13. The MRAM device of claim 12, wherein the first supply voltage and the second supply voltage have different voltage levels, and wherein each of the first and second transistors has a gate-source threshold voltage that is lower than a voltage level difference between the first and second supply voltages.

14. The MRAM device of claim 13, wherein the voltage level of the first supply voltage is larger than the voltage level of the second supply voltage.

15. The MRAM device of claim 11, wherein the MTJ pillar comprises a pinned layer and a free layer, the pinned layer being coupled to the top electrode and the free layer being coupled to the bottom electrode.

16. The MRAM device of claim 13, wherein the MTJ pillar further comprises a tunnel barrier arranged between the free layer and the pinned layer and extending in a first plane, wherein the free layer and/or the pinned layer is/are configured to be magnetized in a direction substantially perpendicular to the first plane.

17. The MRAM device of claim 11, wherein the first and second transistors are n-type transistors.

* * * * *

UNITED STATES PATENT AND TRADEMARK OFFICE
CERTIFICATE OF CORRECTION

PATENT NO. : 11,004,490 B2  
APPLICATION NO. : 16/716024  
DATED : May 11, 2021  
INVENTOR(S) : Sushil Sakhare et al.

Page 1 of 1

It is certified that error appears in the above-identified patent and that said Letters Patent is hereby corrected as shown below:

In the Specification

In Column 2, Line 25, delete "spin orbit torque" and insert --spin-orbit-torque--.

In Column 6, Line 32, delete "spin orbit torque" and insert --spin-orbit-torque--.

In Column 6, Line 33, delete "spin orbit torque" and insert --spin transfer torque--.

In Column 9, Line 18, delete "VSS" and insert --VSS.--.

In the Claims

In Column 12, Line 35, Claim 1, delete "spin orbit torque" and insert --spin-orbit-torque--.

In Column 14, Line 11, Claim 12, delete "spin orbit torque" and insert --spin-orbit-torque--.

In Column 14, Line 13 (approx.), Claim 12, delete "spin orbit torque" and insert --spin transfer torque--.

Signed and Sealed this  
Twenty-sixth Day of October, 2021

Drew Hirshfeld  
*Performing the Functions and Duties of the*  
*Under Secretary of Commerce for Intellectual Property and*  
*Director of the United States Patent and Trademark Office*